United States Patent [19]

Gittleman et al.

[11] Patent Number: 4,859,939
[45] Date of Patent: Aug. 22, 1989

[54] NON-DESTRUCTIVE TESTING OF SOS WAFERS USING SURFACE PHOTOVOLTAGE MEASUREMENTS

[75] Inventors: Jonathan I. Gittleman, Lawrenceville; Stanley Bozowski, Trenton, both of N.J.

[73] Assignee: The United States of America as represented by the Secretary of the Army, Washington, D.C.

[21] Appl. No.: 135,968

[22] Filed: Dec. 21, 1987

[51] Int. Cl.$^4$ .................. G01R 31/26; G01R 31/00
[52] U.S. Cl. .......................... 324/158 R; 324/158 D; 324/74
[58] Field of Search .................. 250/492.2; 324/73 R, 324/71.3, 158 D, 158 R, 74; 437/8

[56] References Cited

U.S. PATENT DOCUMENTS

| | | | |
|---|---|---|---|
| 4,494,069 | 1/1985 | Lin | 324/158 R |
| 4,563,642 | 1/1986 | Munakata et al. | 324/158 R |
| 4,642,565 | 2/1987 | Jastrzebski et al. | 324/158 R |

OTHER PUBLICATIONS

Richard Williams, "Surface Photovoltage Measurements on Cadmium Sulfide", Journal Physical Chemical Solids, 23, 1057 (1962).

J. Lagowski, "Electronic Characterization of Heteroepitaxial Silicon–on–Sapphire by Surface Photovoltage Spectroscopy", J. Electrochem, Soc: Solid-State Science and Technology, 128, 2665 (1981).

Primary Examiner—Reinhard J. Eisenzopf
Assistant Examiner—William J. Burns
Attorney, Agent, or Firm—Freddie M. Bush

[57] ABSTRACT

A device for non-destructive surface photovoltage testing of silicon-on-sapphire (SOS) wafers employs the electrically equivalent of an inserted capacitance in series in a measuring circuit. A pair of thin irridescent coated (TIC) glasses, are positioned on each side of an SOS wafer with an electrical lead attached to each of the conductive coating of tin oxide and indium tin oxide of the TIC glasses. The glass surface (the non-conductive side) of each TIC glass is positioned adjacent to the sapphire layer and silicon layer respectively. An incident light illuminates the sapphire layer and subsequently illuminates the silicon-sapphire interface with a predetermined wave length of light wherein the silicon absorbs all of the light within about 100A of the silicon-sapphire interface. Thus, the incident light is transmitted through the conductive layer of the first TIC glass which is in electrical contact with a detection circuit. The second TIC glass conductive layer is in electrical contact with a calibration signal input which completes the measuring circuit. The measuring circuit with the electrical equivalent of a capacitor in series is able to detect the altered signal resulting from surface photovoltage (SPV) charge due to absorbed incident light which is a measure of the sapphire-silicon interface condition to permit a non-destructive SPV testing of SOS wafers, greatly speeding the pre-selection process of SOS wafers.

4 Claims, 1 Drawing Sheet

NON-DESTRUCTIVE TESTING OF SOS WAFERS USING SURFACE PHOTOVOLTAGE MEASUREMENTS

DEDICATORY CLAUSE

The invention described herein was made in the course of or under a contract or subcontract thereunder with the Government; therefore, the invention described herein may be manufactured, used and licensed by or for the Government for governmental purposes without the payment to us of any royalties thereon.

BACKGROUND OF THE INVENTION

Spectral response measurements show that the photovoltage is produced primarily by strongly absorbed light. Surface photovoltage measurements have been made on cadmium sulfide crystals as disclosed by Richard Williams, Journal Physical Chemistry Solids, 23, 1057 (1962). FIG. 1 of the cited reference depicts a schematic drawing of a mounted crystal and circuit for measuring surface photovoltages. An ohmic contact of gallium-indium alloy is employed to make electrical contact with the crystal to serve as one electrode. A capacitive probe electrode, of transparent glass with conductive coating, is mounted so that this transparent probe electrode is separated from the crystal by an air space of 1 to 2 mils. This electrode and the ohmic contact is electrically connected to a Keithley electrometer amplifier having an input resistance of $10^{11}$ Ohms. The voltage signal obtained is either read directly or displayed on an oscilloscope.

The manufacture of silicon on sapphire (SOS) wafers has required that these wafers be evaluated at stages of processing and when finished for compliance with specification or for wafer preselection. This requirement has been partially met by the disclosed method by J. Lagowiski et al, J. Electrochem, Soc.: Solid-State Science and Technology, 128, Dec. 1981, p. 2665-2670. In this method surface photovoltage spectroscopy is applied to silicon-on-sapphire to enable a simultaneous determination of band structure, trapping centers, deep levels, the refracture index, and the film thickness. This method employs a monochromatic light (energy range 0.5-3.5 eV) which generates photovoltage that is measured with respect to a semitransparent gold electrode which is separated from the illuminated silicon layer of the SOS by a 10 m thick Mylar film or with respect to a semitransparent gold electrode vapor deposited directly on the silicon layer of the SOS.

The advancement of testing techniques for inspecting SOS wafers has been beneficial to the art; however, additional improvements to enable non-destructive testing of SOS wafers would be additionally beneficial.

Therefore, an object of this invention is to provide a device for use in a non-destructive testing method for inspection of silicon on sapphire wafers.

A further object of this invention is to provide a device for use in a non-destructive testing method wherein a capacitance is inserted in series in the measuring and calibration circuits of the device wherein the equivalent capacitance has no adverse effect.

SUMMARY OF THE INVENTION

Measurement of surface photovoltage with back surface illumination of the silicon-sapphire interface without making ohmic contact to the silicon outersurface of a SOS wafer greatly speeds the preselection process at a manufacturing facility. This measurement is achieved with a device which comprises an appropriate light source for illuminating the back surface of a SOS wafer, and a pair of thin iridescent coated (TIC) glasses of tin oxide and indium tin oxide with the coating on one side thereof, with one of TIC glasses, when in use, being positioned between the sapphire layer of the SOS wafer and the light source and the other of TIC glasses being positioned on the silicon layer side of the SOS wafer. The tin oxide and indium tin oxide coating, which is a conductive layer, is positioned with the coated side of each of the TIC glasses (positioned) outward from the SOS wafer. This device additionally comprises detection circuit means electrically connected to the conductive layers of the TIC glass positioned between the sapphire layer and the light source and calibration means electrically connected to the outwardly positioned conductive layer coating of the TIC glass which is positioned adjacent the silicon layer.

The above described structural arrangement is electrically equivalent to inserting a capacitance in series in the measuring circuit and across the surface of the wafer, which has no adverse effect, merely altering the signal somewhat. This structural arrangement permits the use of an electrical contact with the conductive layers of the TIC glasses to achieve a truly non-destructive testing of SOS wafers using surface photovoltage measurements since no physical contact such as an ohmic contact is required for the silicon layer of the SOS wafer

DESCRIPTION OF THE PREFERRED EMBODIMENT

Figure 2:
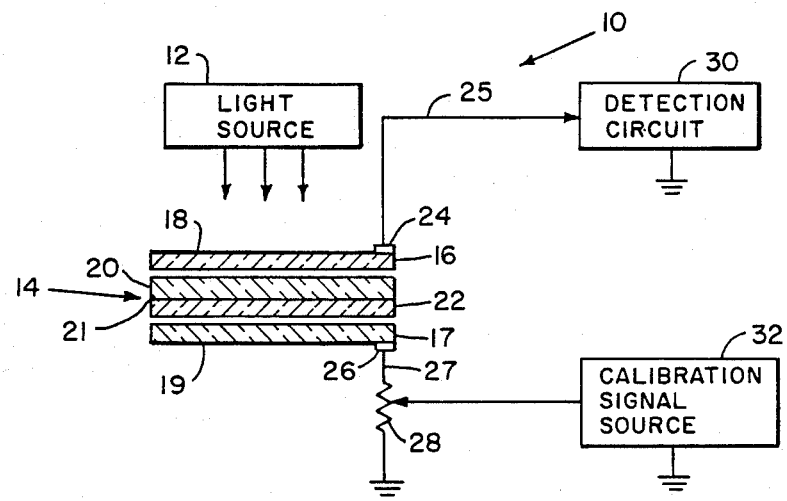
FIG. 2 of the drawing is a schematic drawing of a SOS wafer with a pair of TIC glass plates wherein the conductive layer of the TIC glass plates are in series electrically with a detection circuit and a calibration signal source employed for surface photovoltage measurements.

The structural arrangement of FIG. 2 of the drawing depicts applicants' device 10 for non-destructive evaluation of a SOS wafer by surface photovoltage measurement methods. The relationship of the SOS wafer to the TIC glasses, coated on one side to render the TIC glasses conductive, is electrically equivalent to inserting capacitors in series in the measuring circuit and the calibration input signal circuit. The described arrangement, as shown in the drawing, has no adverse effect, merely altering the signal somewhat; however, this arrangement permits non-destructive testing of the SOS wafer as further described below.

In further reference to FIG. 2, a light source 12 is employed to illuminate a SOS wafer 14 through a first TIC glass 16 having a conductive coated surface 18. The silicon layer 22 is illuminated through the sapphire layer 20 and the silicon-sapphire interface 21. A contact 24 to a first electrical lead 25 couples the first TIC glass 16 electrically with a detection circuit 30. Another contact 26 to a second electrical lead 27 couples the conductive surface 19 of a second TIC glass 17 electrically with a calibration signal source 32 through a potentiometer or variable resistor 28. Electrical signal detection circuits and calibration circuits are well known in the art and, as such, are not discussed in detail herein.

In use the device as depicted in FIG. 2 of the drawing utilizies back surface illumination of a SOS wafer with a light source having a predetermined wave length which penetrates with the incident light the sapphire layer 20 and the silicon-sapphire interface 21. The wavelength of light employed should be such that all the incident light is absorbed in the silicon layer 22 within about 100A of the silicon-sapphire interface. The wavelength in micrometers for detector materials is shown in Optical Materials Properties by A. J. Moses (IFI/Plenum, New York 1971). This source of data depicts 10% cutoff points of 0.15–6.5 μm for sapphire and 10% cutoff points of 1.2–15 m for silicon; therefore, a desired wavelength of the incident light is readily selectable, as disclosed in this literature source and other similar sources in the open literature. Spectral response measurements show that photovoltage is produced mainly from the absorbed light in the silicon of the silicon layer.

In the construction of a semiconductor, photo-coated carriers will drift to the surface of the semiconductor to neutralize the space charge created by surface states. This drift results in a measurable surface photovoltage (SPV) when the wafer is subjected to optical energy as noted above. Because of this phenomena the non-destructive testing device of SOS wafers using surface photovoltage measurements in accordance with this invention has become a reality.

Figure 1:
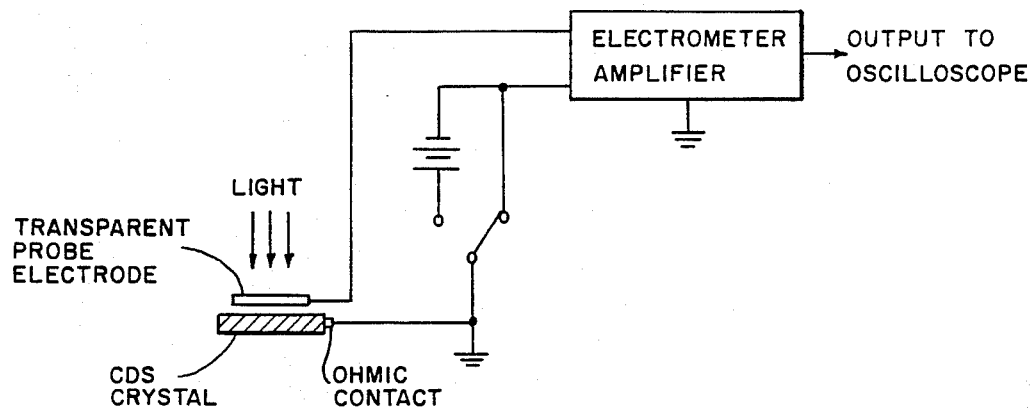
FIG. 1 of the drawing is a prior art schematic drawing of a mounted crystal and circuit for measuring surface photovoltage.

The ohmic contact to a crystal surface as depicted in prior art test configuration of FIG. 1 causes destructive testing of the silicon wafer. In still further reference to FIG. 2, the electrical contact is made with the conductive layer of the first TIC glass on the sapphire side and with the conductive layer of the second TIC glass on the silicon side of the SOS wafer. The incident light shines through a first TIC glass that is electrically connected to a detection circuit. The predetermined wavelength of the incident light is such that all the light is absorbed in the silicon portion of the SOS and within about 100A (Angström) of the sapphire and silicon interface. The susceptibility of a SOS wafer to radiation-induced back channel leakage can be evaluated since photon-created carriers drift to the surface of a semiconductor to neutralize the space charge created by surface states. This drift of the photon-created carriers results in a measurable surface photvoltage (SPV) without destruction of the wafer while being measured. The technique of measurement is a particularly significant improvement over the prior art since it serves as an effective tool for wafer evaluation without damage or destruction of the wafer being measured.

We claim:

1. A method for non-destructive testing of a silicon-on-sapphire wafer using surface photovoltage measurements in a pre-selection process for evaluating the region within about 100A of the silicon-sapphire interface, said method comprising:
   (i) providing a silicon-on-sapphire wafer for testing, said SOS wafer having a sapphire layer interfaced with a silicon layer;
   (ii) positioning said wafer so that said sapphire layer will be illuminated first by a predetermined wavelength of incident light from a light source;
   (iii) providing a light source for emitting a predetermined wavelength of incident light which is capable of being strongly absorbed by said silicon layer after said incident light is transmitted through said sapphire layer;
   (iv) positioning a first thin iridescent coated glass having a glass substrate with said thin irridescent coating which is a conductive layer comprised of tin oxide and indium tin oxide on one side of said glass substrate;
   (v) placing one end of a first electrical lead in electrical contact with said first thin irridescent coated glass and extending the other end of said electrical lead to a detection circuit;
   (vi) positioning a second thin irridescent coated glass having the structure set forth hereinabove so that the glass substrate side of said thin irridescent coated glass is on the silicon outer surface of said silicon-on-sapphire wafer and said conductive layer is faced outwardly from said silicon layer;
   (vii) placing one end of a second electrical lead in electrical contact with said second thin irridescent coated glass and extending the other end of said electrical lead to a calibration signal source;
   (viii) directing light from said light source so that said incident light illuminates said conductive layer of said first thin irridescent coated glass, said incident light illuminating said sapphire layer next, and subsequently impinging upon said silicon-sapphire interface wherein said silicon layer absorbs all of the predetermined wavelength within about 100A of said silicon layer as measured from said silicon-sapphire interface; and,
   (ix) making surface photovoltage measurements and interpreting said photovoltage measurements made in a preselection process for evaluating said silicon-on-sapphire wafer and said region within 100A of said silicon-sapphire interface while said incident light is impinging on said wafer.

2. A device for measuring photovoltage for use in a pre-selection process in the non-destructive testing of a silicon-on-sapphire wafer, said device comprising:
   (i) a light source for emitting a predetermined wavelength of incident light which is capable of being absorbed by the silicon layer within about 100A of the silicon-sapphire interface;
   (ii) a first thin irridescent coated glass positioned with the coated surface facing said light source, said coated surface being transparent to said predetermined wavelength and said coated surface being conductive;
   (iii) detection circuitry for measuring voltage indicative of optically stimulated current flow in said wafer, said first thin irridescent coated glass being coupled to said detection circuitry;
   (iv) a second thin irridescent coated glass and being spaced apart a predetermined distance from said first thin irridescent coated glass positioned with the coated surface of said second thin iridescent glass facing outward with respect to said first thin irridescent coated glass, said spaced apart predetermined distance being able to accommodating a tested silicon-on-sapphire wafer between said thin irridescent coated glasses; and,
   (v) calibration circuitry for calibrating said device, said second thin irridescent coated glass being coupled to said calibration circuitry.

3. The device as set forth in claim 2 wherein said calibration circuitry comprises a calibration signal source coupled through a variable resistor to said second thin irridescent coated glass.

4. The device as set forth in claim 3 wherein said wafer is positioned between said first and second thin irridescent coated glasses during calibration and voltage measurements.

* * * * *